United States Patent
Hein et al.

(10) Patent No.: US 7,882,946 B2
(45) Date of Patent: Feb. 8, 2011

(54) GUIDE ARRANGEMENT WITH AT LEAST ON GUIDE ROLLER FOR THE GUIDANCE OF WEBS IN WEBS TREATMENT INSTALLATIONS

(75) Inventors: Stefan Hein, Blankenbach (DE); Peter Skuk, Nidderau (DE); Karl-Heinz Wenk, Bad Nauheim (DE); Reiner Kukla, Hanau (DE); Rainer Ludwig, Hosbach (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 373 days.

(21) Appl. No.: 11/081,879

(22) Filed: Mar. 17, 2005

(65) Prior Publication Data

US 2005/0224551 A1    Oct. 13, 2005

(30) Foreign Application Priority Data

Apr. 13, 2004   (EP) ................................ 04008699

(51) Int. Cl.
*B65H 23/00*   (2006.01)
(52) U.S. Cl. .................. 198/807; 198/806; 226/190; 226/180; 242/615.2; 204/198
(58) Field of Classification Search .............. 198/806, 198/807, 808, 837; 226/180, 190; 242/615.2
See application file for complete search history.

(56) References Cited

U.S. PATENT DOCUMENTS

| | | | | |
|---|---|---|---|---|
| 2,090,385 A | * | 8/1937 | Faigle et al. .................. | 68/160 |
| 2,750,924 A | * | 6/1956 | Knight ......................... | 401/83 |
| 3,750,924 A | * | 8/1973 | Pepper ........................ | 226/174 |
| 4,007,865 A | * | 2/1977 | Crandall ...................... | 226/17 |
| 4,196,803 A | * | 4/1980 | Lovett ......................... | 198/806 |
| 4,231,504 A | * | 11/1980 | Ketzer ......................... | 226/180 |
| 4,485,125 A | | 11/1984 | Izu et al. | |
| 4,544,253 A | * | 10/1985 | Kummerl ..................... | 396/620 |
| 4,554,253 A | * | 11/1985 | Imahori et al. ........... | 435/286.5 |
| 4,834,277 A | * | 5/1989 | Gomoll et al. .............. | 226/101 |
| 5,011,060 A | * | 4/1991 | Cramer ........................ | 226/15 |
| 5,447,748 A | * | 9/1995 | Kitaori et al. ............... | 427/130 |

(Continued)

FOREIGN PATENT DOCUMENTS

EP    0 733 736 A    9/1996

*Primary Examiner*—Gene Crawford
*Assistant Examiner*—Kavel P Singh
(74) *Attorney, Agent, or Firm*—Patterson & Sheridan, LLP

(57) ABSTRACT

A guide arrangement (1) for guiding webs in evacuatable web treatment installations comprises at least one guide roller (2) with an axis (5), whose spatial position is settable. To solve the problem of compensating in modular installations with several chambers either misalignments of the chambers relative to one another and/or to avoid completely adjustable roller frames, whose adjustment would require the repositioning of treatment and coating sources and of separating gaps on the circumference of coating rollers, the invention proposes that the guide roller (2) is supported between two pivot bearings (11, 12), of which at least one is adjustable relative to the other transversely to the axis (5). This is preferably carried out thereby that the adjustable pivot bearing (12) comprises a slide guide (15), fastened to a chamber wall (14), on which a slide (16) with the pivot bearing (12) is guided, and that the adjustable pivot bearing (12) comprises a remotely operated adjustment drive (21).

8 Claims, 3 Drawing Sheets

U.S. PATENT DOCUMENTS

| | | |
|---|---|---|
| 5,699,898 A | 12/1997 | Bartelmuss et al. |
| 6,068,172 A * | 5/2000 | Huber ..................... 226/118.3 |
| 6,213,285 B1 * | 4/2001 | Smith ...................... 198/465.1 |
| 6,241,078 B1 * | 6/2001 | Mott ........................... 198/806 |
| 6,325,198 B1 * | 12/2001 | Pattantyus-Abraham et al. ....................... 198/339.1 |
| 6,685,008 B2 * | 2/2004 | Schiesser et al. ............ 198/782 |
| 2001/0040097 A1 | 11/2001 | Arao et al. |

* cited by examiner

GUIDE ARRANGEMENT WITH AT LEAST ON GUIDE ROLLER FOR THE GUIDANCE OF WEBS IN WEBS TREATMENT INSTALLATIONS

This application claims priority from EP Patent Application No: 04 008 699.3-1215 filed Apr. 13, 2004, herein incorporated by reference in its entirety.

The invention relates to a guide arrangement in evacuatable web treatment installations for the guidance of webs.

BACKGROUND AND SUMMARY OF THE INVENTION

Through the paper "Engineering Solutions Enabling a New Family of Expandable, Multi-Process, Multi-Chamber Vacuum Roll Coaters", published 1999, Society of Vacuum Coaters, 42nd Annual Technical Conference Proceedings (1999) ISSN 0737-5921, pp. 475 to 479, it has become known to connect in series a large number of modular chambers and lock valves in order to be able to carry out sequentially any desired coating and treatment processes of webs. However, this presupposes the highly precise orientation of the module chambers, in order to make possible the trouble-free transport of the webs through all chambers and their connection slots.

The installation is one that is combined or can be combined out of chamber modules, for which no possibilities for the relative orientation of the chambers with respect to one another and no internal means for the correction of the web running path are specified.

DE 197 35 603 C1 discloses disposing in the individual module chambers, separated by web valves, roller frames with guide and coating rollers, such that the web traversal can be adapted through the registration or torsion of the roller frames relative to one another. Since hereby the coating rollers, denoted as cooling rollers, are also rotated, it is required to adapt by adjustment the coating sources, so-called magnetron sputter sources, to the spatial position of the coating rollers. Such setting or registration is cumbersome, time consuming and complicated and assumes a vast number of adjusting mechanisms and manual setting processes. Not disclosed are especially solutions to the problem, that through the adjustment of the coating rollers the gap widths between their surfaces and stationary chamber partitioning walls, which encompass the coating rollers, are also changed.

U.S. Pat. No. 4,485,125 discloses affecting near the end of an arcuate running path of travel of a web through a long series of vacuum chambers, disposed in the form of an arc, the remaining path thereby that before the winding-up the web is allowed to run over a single roller whose one bearing can be adjusted eccentrically such that a telescopic winding on the take-up winding roller is avoided. While it is possible to adjust under remote operation the direction of the eccentricity through a light barrier, not, however, the degree of the eccentricity. Direction of adjustment and eccentricity are therewith coupled necessarily, and this can have a negative effect. The eccentricity must be kept low, for example a few thousandths of an inch, in order for the web not to abut the slot edges which are disposed in front and above said roller. The installation is one combined or that can be combined out of chamber modules for which no possibilities for the relative orientation of the chambers with respect to one another are specified.

EP 0 733 736 A2 discloses in the case of a non-vacuum installation, for example in paper production by means of a continuous running belt, such as a screen belt or conveyor belt, to adjust the angular position of at least one of the plurality of rollers forming a roller array through its one bearing block directed movably on rollers, relative to the running direction of the belt. Such continuous belts form a loop which is inherent to the installation and is not wound up, but rather serves for the underpropping and for the transport of the finite paper web or the product to be treated. The problem of telescopic winding of the paper web is not addressed; rather, the issue involves only avoiding the lateral migration of the continuous belt on the roller array. The device does not pertain to the species.

In its introduction U.S. 2001/0040097 A1 clearly expresses a position in contrast to the above cited U.S. Pat. No. 4,485, 125. Disclosed is an apparatus operated for the galvanic coating with liquid baths and water. Vacuum processes are conventionally operated in a vacuum of less than 1 mbar, for example up to $10^{-2}$ mbar and below. In such a vacuum an aqueous fluid would evaporate to a large extent. Transfer of the known solution to vacuum processes is thus neither disclosed nor made obvious.

The invention therefore has as its aim to specify a guide arrangement of the above described species, in which the absolutely linear orientation of the individual chamber modules becomes superfluous, and in which the web guidance can be set and fixed in position independently of possibly not exactly linear spatial positions of the coating rollers and of the treatment and coating sources and chamber modules.

The solution of the posed aim is achieved according to the invention through the distinguishing features in the characterizing clause of patent claim 1.

The invention avoids the disadvantages of prior art, in particular a guide arrangement of the above described species is specified, in which the absolutely linear orientation of the individual chamber modules becomes superfluous, and in which the web guidance can be set and fixed in position independently of possibly not exactly linear spatial positions of the coating roller and/or of the treatment and coating sources and chamber modules and can be carried out without great constructional and operational effort.

The invention therefore has as its aim to specify a guide arrangement of the above described species, in which an absolutely linear orientation of the individual chamber modules becomes unnecessary, and in which the web guidance can be set and fixed in position independently of the spatial positions of the coating roller and of the treatment and coating sources and chambers.

The defined aim is attained according to the invention thereby that the guide roller is supported between two pivot bearings, of which at least one is adjustable relative to the other transversely to the axis.

The invention avoids the disadvantages of prior art. In particular a guide arrangement of the above described species is specified, in which the absolutely linear orientation of the individual chamber modules becomes superfluous, and in which the web guidance can be carried out settably and fixably independently of the spatial positions of the coating roller and/or the treatment and coating sources and chambers without great constructional and operational effort.

It is especially advantageous if within the scope of additional embodiments of the invention—either singly or in combination:

the adjustable pivot bearing is adjustable parallel to the chamber wall, the adjustable pivot bearing comprises a slide guide fastened on the chamber wall, on which a slide with the pivot bearing is guided, the adjustable pivot bearing is pivotably mounted on the slide, the adjustment direction of the slide guide lies in the bisecting line of the arc of contact of the guide roller by the web, the adjustable pivot bearing comprises a remotely operated adjustment drive, the adjustment drive is comprised of an electromotor, a step-down gear and a rotation coupling, the rotation coupling comprises an elastic intermediate member, the electromotor, the step-down gear and the rotation coupling have axes aligned with one another, the aligned axes are oriented parallel to the displacement direction of the slide guide, the portion, not covered by the slide, of the slide guide is covered by at least one bellows, the slide guide comprises at both ends one stop each, the pivot bearing, not adjustable in the transverse direction, on the other end of the guide roller is pivotably fastened on a holding fixture, the holding fixture of the nonadjustable pivot bearing has axial tolerance for the compensation of angle and length changes of the guide roller, in a series disposition of evacuatable chambers the adjustable guide rollers are each disposed in front of a slot forming the passage opening to the succeeding chamber, in a series disposition of evacuatable chambers the adjustable guide rollers are each disposed behind a slot forming the passage opening to the succeeding chamber, in the proximity of at least one edge of the traversing web at least one optical sensor is disposed for the acquisition of the traversal of this edge and for affecting the adjustment drive, on the web traversal on a line perpendicular to the web edge several optic sensors are disposed for determining the instantaneous web traversal, the web treatment installation is comprised of a series disposition of at least two chamber modules, in each of which an adjustable guide roller is disposed in front of a passage opening in the form of a slot to the succeeding chamber, the orientation of the web running direction in the chambers of a web treatment installation combined out of individual chamber modules, in the event the web running direction deviates from a straight line on the roller arrangements of the adjacent chamber modules, not oriented exactly with respect to one another, in at least one of these chamber modules can be set through at least one adjustable guide roller, and/or if the guide arrangement with at least one guide roller, which comprises an axis and is supported between two pivot bearings, of which at least one is disposed such that it is adjustable relative to the other by means of a slide guide with one slide transversely to the axis on a chamber wall, is utilized for the compensation of deviations of the running direction of webs in at least one chamber of an evacuatable web treatment installation combined out of individual chamber modules not oriented exactly with respect to one another.

In the following embodiment examples of the subject of the invention and their operational mechanisms will be explained in further detail in conjunction with FIGS. 1 to 3.

DETAILED DESCRIPTION

Figure 1:
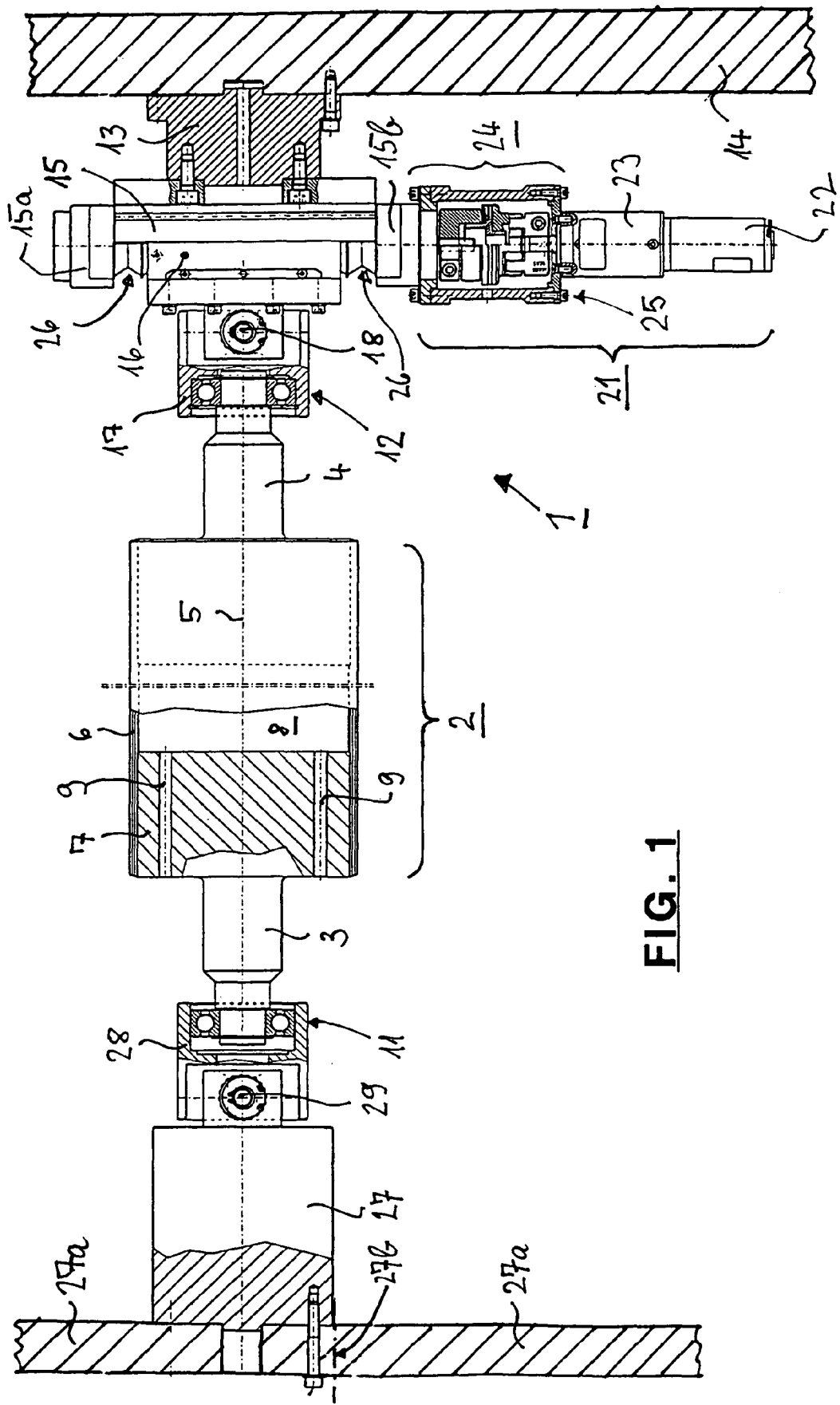
FIG. 1 a partially sectioned view of a guide arrangement with radial viewing direction onto the axis of the guide roller, FIG. 2 a radial section through a guide roller with a web guided thereover, and FIG. 3 a perspective view of two chamber modules in series one with the other of treatment or coating installations.

FIG. 1 depicts a guide arrangement 1 with a guide roller 2, of which, however, only the two ends with their journal pins 3 and 4 are shown and which comprises an axis 5, a shell 6 concentric with it and two end pieces 7. The interior space 8 communicates via venting and aerating bores 9 with the environs, i.e. the chamber volume.

Figure 2:
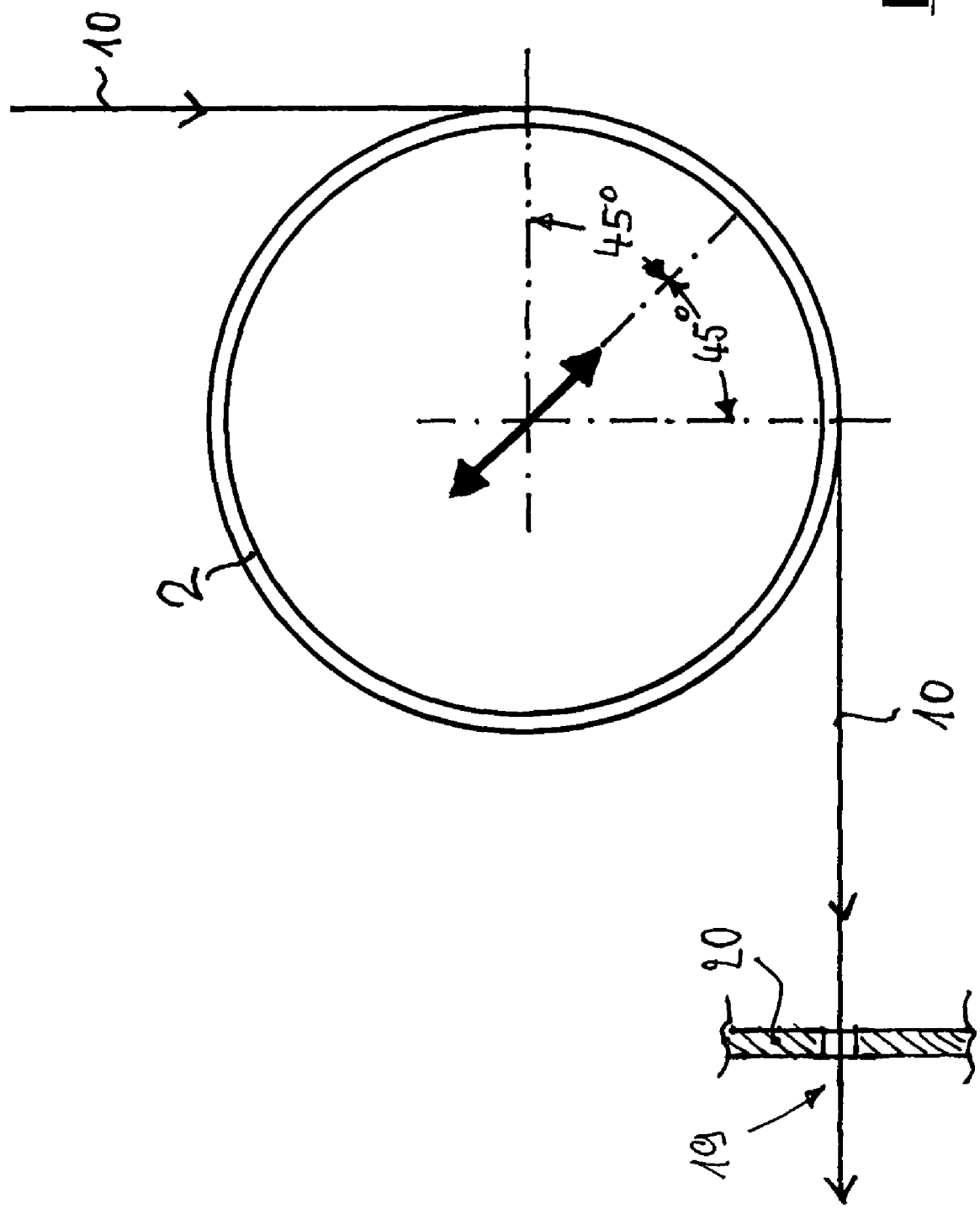
Figure 3:
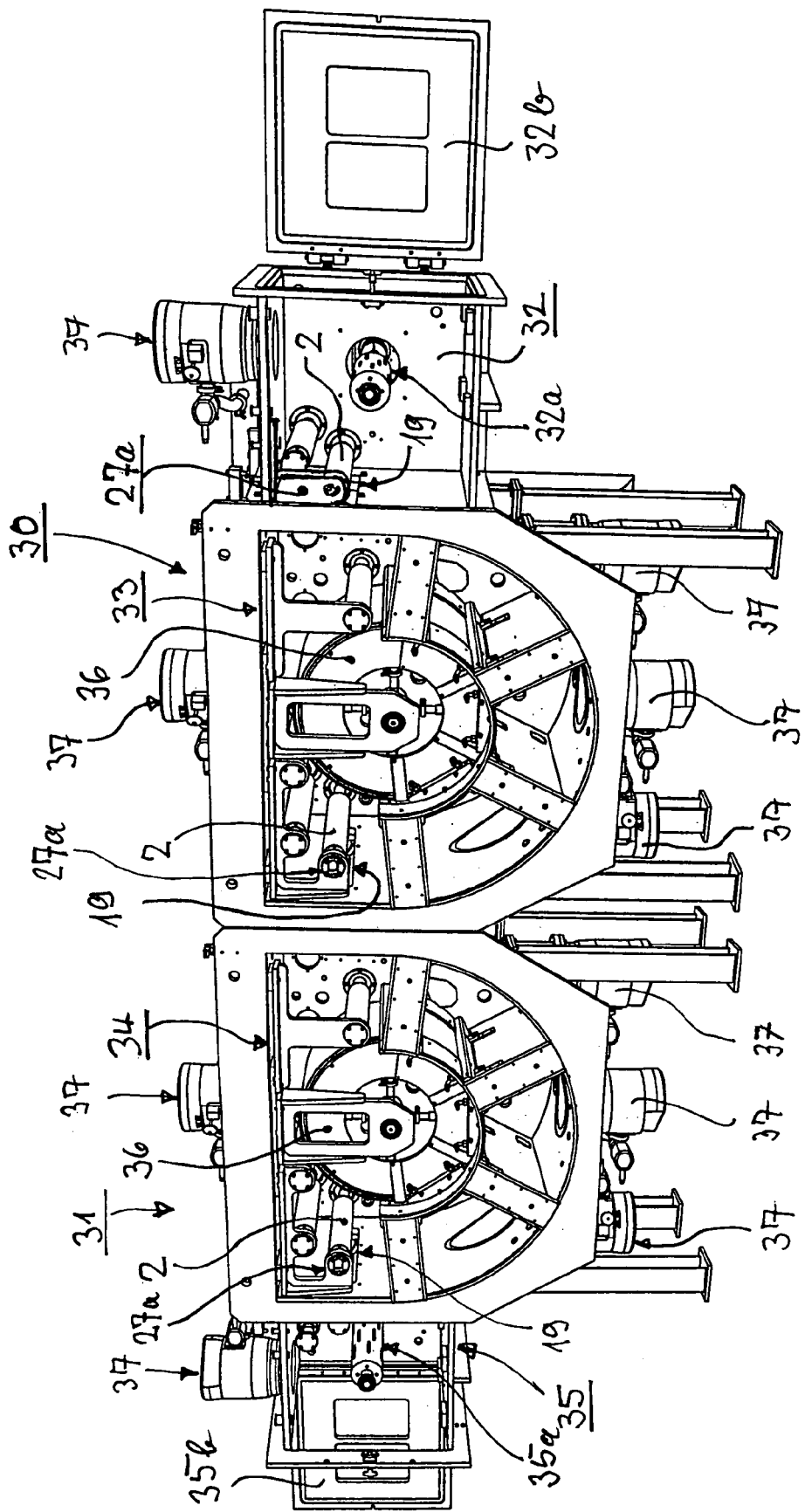

The guide roller 2 serves for the guidance of webs 10 (see FIG. 2) in evacuatable web treatment installations according to FIG. 3. The spatial position of the axis 5 can be adjusted thereby that the guide roller 2 is supported between two pivot bearings 11 and 12, of which the right one is adjustable relative to the left one transversely to axis 5. The adjustable pivot bearing 12 is fastened by means of a holding fixture 13 on a chamber wall 14 and adjustable parallel to it.

This is carried out thereby that the adjustable pivot bearing 12 comprises a slide guide 15 fastened on the chamber wall 14, on which slide guide a slide 16 with the pivot bearing 12 is guided. This is pivotably mounted on slide 16 via a bearing housing 17 by means of a swivel bearing 18.

According to FIG. 2 the adjustment direction (double arrow) of the slide guide 15 lies in the bisecting line of the arc of contact of, for example, 90 degrees of the guide roller 2 by the web 10. Hereby through a minimum adjustment range a maximum change of the web running direction transversely to web 10 can be attained, such that the latter, without contact with the edge of a slot 19 in a partitioning wall 20, can be guided between two chamber volumes and be taken over by the web guide in the succeeding chamber volume. However, in principle an adjustment into any spatial positions is possible. An adjustment can also be omitted if the web running path already meets the specifications. A person skilled in the art can choose between maximum adjustment effect and maximum adjustment precision by deviating from the bisecting line of the arc.

The adjustable pivot bearing 12 comprises a remotely operated adjustment drive 21 comprised of an electromotor 22, a step-down gear 23 and a rotation coupling 24 and placed in a supporting housing 25, which can be vented and aerated. The rotation coupling 24 includes an elastic intermediate member which is not provided with a reference number. The electromotor 22, the step-down gear 23 and the rotation coupling 24 have axes aligned with one another, which are oriented parallel to the displacement direction of the slide guide 15. The portion of the slide guide 15, not covered by slide 16, is covered by at least one bellows 26. The slide guide 15 comprises one stop 15a and 15b at each end.

The orientation of the guide roller 2 or the traversing web 10, respectively, can be automated thereby that the position of the edge of the web 10 is detected via an (not shown) optical sensor, which, via a control element, for example the adjustment drive 21, orients the guide roller 2 accordingly. It is also feasible to employ several optical sensors on a line perpendicular to the web edge, through which the instantaneous position of the web 10 is acquired.

The left pivot bearing 11, which is not adjustable transversely to axis 5, is fastened on the other end of guide roller 2 swivellably on a stationary holding fixture 27, and specifically via a bearing housing 28 and a further swivel bearing 29. The disposition is herein such that the holding fixture 27 of the nonadjustable pivot bearing 11 has axial tolerance for the compensation of angle and length changes of the guide roller 2. A suspension 27a can be comprised of a chamber wall or by a mounting lug suspended on the chamber ceiling. In the latter case, also shown in FIG. 3, the suspension terminates at the dot-dash delimiter line 27b.

FIG. 3 shows a perspective view of two chamber modules 30 and 31 in series one with the other of treatment or coating installations, which are comprised of the series disposition of evacuatable chambers 32, 33, 34 and 35, in which the adjustable guide rollers 2 are each disposed in front of a passage opening in the form of a slot 19 to the succeeding chamber, as is indicated in FIG. 2.

Chamber 32 is an inward transport lock chamber with a rotatable arbor 32a for an (not shown here) untreated web roll and a closure flap 32b. The chamber modules 30 and 31 are structured similarly. Their chambers 33 and 34 are also evacuatable and each has in its center a cooled coating roller 36 on the circumference of which four radial partitioning walls are disposed, which are here not provided with reference numbers and whose inner ends, with the exception of a narrow gap, extend up to the particular emplaced web 10.

Above the two uppermost partitioning walls is located a common subchamber for all guide and deflection rollers, beneath said partitioning walls are located three sector-shaped subchambers for sliding in, not shown, treatment and/or coating sources, which are fastened on a closure plate which is also not shown here and which can be moved away. All subchambers are connected to their own vacuum pumps 37.

Chamber 35 is an outward transport lock chamber with a rotatable arbor 35a for a treated web roll, not shown here, and a closure flap 35b. The front closure walls of the chambers 32 and 35 are also omitted to permit inspecting the inside.

The guide rollers 2 are not driven, but are "dragged" by the particular emplaced web. They also do not need to have a cylindrical surface, but can also be implemented as expander rollers in banana form or with conical roller segments, whose shell lines traverse a common, aligned and linear take-off. The number of chamber modules 30 and 31 is nearly arbitrary.

In contrast to, for example, DE 197 35 603 C1, neither the coating roller nor the treatment and coating sources nor the partitioning walls between the subchambers need to be repositioned with a registration of the guide roller to follow its movement.

LIST OF REFERENCE NUMBERS

1 Guide arrangement
2 Guide roller
3 Bearing journal pin
4 Bearing journal pin
5 Axis
6 Shell
7 End pieces
8 Interior space
9 Venting and aerating bores
10 Web
11 Pivot bearing
12 Pivot bearing
13 Holding fixture
14 Chamber wall
15 Slide guide
15a Stop
15b Stop
16 Slide
17 Bearing housing
18 Swivel bearing
19 Slot
20 Partitioning wall
21 Adjustment drive
22 Electromotor
23 Step-down gear
24 Rotation coupling
25 Housing
26 Bellows
27 Holding fixture
27a Suspension device
27b Delimiting line
28 Bearing housing
29 Swivel bearing
30 Chamber module
31 Chamber module
32 Chamber
32a Holding arbor
32b Closure flap
33 Chamber
34 Chamber
35 Chamber
35a Holding arbor
35b Closure flap
36 Coating roller
37 Vacuum pumps It is claimed:

1. A web treatment vacuum installation, comprising an arrangement of chamber modules individually evacuable by vacuum pumps, wherein for guidance of a web to be tread at least one guide roller is provided, the at least one guide roller having two ends, each comprising a rotatable journal pin, and a rotation axis of the guide roller extending through the two ends, each rotatable journal pin being supported by one of the two pivot bearings, wherein a) coating rollers for coating the web thereon are disposed in the chamber modules, and wherein b) the chambers are connected to one another through gap-shaped slots, and wherein the position of at least one of the two pivot bearings is adjustable relative to the other pivot bearing and transversely to the rotation axis of the guide roller, such that the web is guided through an adjacent slot of the gap-shaped slots without contact with an edge of the adjacent slot wherein the adjustment direction of the pivot bearing lies in the bisecting line of the arc of contact of the guide roller by the web.

2. A web treatment vacuum installation, comprising an arrangement of chamber modules individually evacuable by vacuum pumps, wherein for guidance of a web to be tread at least one guide roller is provided, the at least one guide roller having two ends, each comprising a rotatable journal pin, and a rotation axis of the guide roller extending through the two ends, each rotatable journal pin being supported by one of the two pivot bearings, wherein a) coating rollers for coating the web thereon are disposed in the chamber modules, and wherein b) the chambers are connected to one another through gap-shaped slots, and wherein the position of at least one of the two pivot bearings is adjustable relative to the other pivot bearing and transversely to the rotation axis of the guide roller, such that the web is guided through an adjacent slot of the gap-shaped slots without contact with an edge of the adjacent slot wherein the adjustable pivot bearing comprises a remotely operated adjustment drive and the adjustment drive is comprised of an electromotor, a step-down gear and a rotation coupling.

3. The installation as claimed in claim 2, wherein the rotation coupling includes an elastic intermediate member.

4. The installation as claimed in claim 2, wherein the electromotor, the step-down gear and the rotation coupling have axes aligned with one another.

5. The installation as claimed in claim 4, wherein the aligned axes are oriented parallel to the displacement direction of the slide guide.

6. A web treatment vacuum installation, comprising an arrangement of chamber modules individually evacuable by vacuum pumps, wherein for guidance of a web to be tread at least one guide roller is provided, the at least one guide roller having two ends, each comprising a rotatable journal pin, and a rotation axis of the guide roller extending through the two ends, each rotatable journal pin being supported by one of the two pivot bearings, wherein a) coating rollers for coating the web thereon are disposed in the chamber modules, and wherein b) the chambers are connected to one another through gap-shaped slots, and wherein the position of at least one of the two pivot bearings is adjustable relative to the other pivot bearing and transversely to the rotation axis of the guide roller, such that the web is guided through an adjacent slot wherein the at least one adjustable pivot bearing comprises a slide guide on which is guided a slide with the pivot bearings and, wherein the portion of the slide guide not covered by the slide is covered by at least one bellows.

7. A web treatment vacuum installation, comprising an arrangement of chamber modules individually evacuable by vacuum pumps, wherein for guidance of a web to be treated at least one guide roller is provided, the at least one guide roller being supported between two pivot bearings, the at least one guide roller having two ends and a rotation axis of the guide roller extending through the two ends, each end being supported by one of the two pivot bearings, wherein
   a) coating rollers for coating the web thereon are disposed in the chamber modules, and wherein
   b) the chambers are connected to one another through gap-shaped slots, and wherein the position of at least one of the two pivot bearings is adjustable relative to the other pivot bearing and transversely to the rotation axis of the guide roller, such that the web is guided through an adjacent slot of the gap-shaped slots without contact with an edge of the adjacent slot, wherein the at least one adjustable pivot bearing comprises a remotely operated adjustment drive comprising an electromotor.

8. The installation as claimed in claim 2, wherein the adjustment drive comprises an electromotor.

* * * * *

UNITED STATES PATENT AND TRADEMARK OFFICE
CERTIFICATE OF CORRECTION

| | | |
|---|---|---|
| PATENT NO. | : 7,882,946 B2 | Page 1 of 1 |
| APPLICATION NO. | : 11/081879 | |
| DATED | : February 8, 2011 | |
| INVENTOR(S) | : Hein et al. | |

It is certified that error appears in the above-identified patent and that said Letters Patent is hereby corrected as shown below:

Column 6, Claim 1, Line 30, please delete "tread" and insert --treated-- therefor;

Column 6, Claim 1, Line 31, please insert --the at least one guide roller being supported between two pivot bearings,-- after provided,;

Column 6, Claim 2, Line 49, please delete "tread" and insert --treated-- therefor;

Column 6, Claim 2, Line 50, please insert --the at least one guide roller being supported between two pivot bearings,-- after provided,;

Column 7, Claim 6, Line 9, please delete "tread" and insert --treated-- therefor;

Column 7, Claim 6, Line 10, please insert --the at least one guide roller being supported between two pivot bearings,-- after provided,;

Column 7, Claim 6, Line 22, please delete "bearings" and insert --bearing-- therefor;

Column 7, Claim 6, Line 23, please delete "and, wherein" and insert --and-- therefor.

Signed and Sealed this
Twenty-fourth Day of May, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,882,946 B2 | Page 1 of 1 |
| APPLICATION NO. | : 11/081879 | |
| DATED | : February 8, 2011 | |
| INVENTOR(S) | : Hein et al. | |

It is certified that error appears in the above-identified patent and that said Letters Patent is hereby corrected as shown below:

Title page item (75):

Please delete "Karl-Heinz Wenk" and insert --Karl-Heinrich Wenk-- therefor.

Signed and Sealed this
Twenty-seventh Day of March, 2012

David J. Kappos
*Director of the United States Patent and Trademark Office*